(12) United States Patent  
Duan et al.

(10) Patent No.: US 11,930,692 B2  
(45) Date of Patent: Mar. 12, 2024

(54) DISPLAY PANEL, DISPLAY MODULE, AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Yanqiang Duan, Wuhan (CN); Yuelong Song, Wuhan (CN); Caihua Ding, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 895 days.

(21) Appl. No.: 16/966,006

(22) PCT Filed: Mar. 19, 2020

(86) PCT No.: PCT/CN2020/080199  
§ 371 (c)(1),  
(2) Date: Jul. 30, 2020

(87) PCT Pub. No.: WO2021/047163  
PCT Pub. Date: Mar. 18, 2021

(65) Prior Publication Data  
US 2023/0165125 A1     May 25, 2023

(30) Foreign Application Priority Data

Sep. 10, 2019    (CN) .......................... 201910853128.5

(51) Int. Cl.  
*H10K 59/65*      (2023.01)  
*H10K 59/12*      (2023.01)  
(Continued)

(52) U.S. Cl.  
CPC ........... *H10K 77/111* (2023.02); *H10K 59/12* (2023.02); *H10K 59/121* (2023.02); *H10K 59/65* (2023.02); *H10K 59/8722* (2023.02)

(58) Field of Classification Search  
CPC ............ H10K 2102/311; H10K 77/111; H10K 77/10; H10K 59/12; H10K 59/1201; H10K 59/121  
See application file for complete search history.

(56) References Cited

U.S. PATENT DOCUMENTS

2017/0262109 A1*   9/2017   Choi ..................... H10K 59/122  
2018/0026079 A1*   1/2018   Lee ......................... H10K 59/38  
                                                                                               257/40

(Continued)

FOREIGN PATENT DOCUMENTS

CN         107277196 A     10/2017  
CN         107945683 A      4/2018  
(Continued)

*Primary Examiner* — Kretelia Graham  
*Assistant Examiner* — William Henry Anderson  
(74) *Attorney, Agent, or Firm* — PV IP PC; Wei Te Chung; Zhigang Ma

(57) ABSTRACT

The present application provides a display panel, a display module, and a display device. A flexible substrate of the display panel includes a first flexible substrate and a second flexible substrate, and the first flexible substrate is provided with a first through-hole corresponding to a lighting path of an electronic component. Based on the first through-hole, light transmittance of the display panel is increased, so that electronic components such as a camera can be disposed below the display panel, and a narrow bezel design is realized.

18 Claims, 10 Drawing Sheets

(51) Int. Cl.
*H10K 59/121* (2023.01)
*H10K 59/80* (2023.01)
*H10K 77/10* (2023.01)

(56) References Cited

U.S. PATENT DOCUMENTS

| | | | |
|---|---|---|---|
| 2018/0033978 A1* | 2/2018 | Ohno | H10K 77/111 |
| 2018/0095502 A1* | 4/2018 | Yamazaki | H10K 59/121 |
| 2020/0328375 A1* | 10/2020 | Won | H10K 71/00 |
| 2021/0066669 A1* | 3/2021 | Kubota | H10K 50/865 |
| 2021/0193974 A1* | 6/2021 | Chen | H10K 59/12 |
| 2021/0215862 A1* | 7/2021 | Jiang | H10K 77/111 |
| 2022/0302406 A1* | 9/2022 | Yee | H10K 50/841 |

FOREIGN PATENT DOCUMENTS

| | | |
|---|---|---|
| CN | 107946341 A | 4/2018 |
| CN | 108598115 A | 9/2018 |
| CN | 109683664 A | 4/2019 |
| CN | 109786426 A | 5/2019 |
| CN | 109860267 A | 6/2019 |
| CN | 110211972 A | 9/2019 |
| CN | 110600516 A | 12/2019 |

\* cited by examiner

DISPLAY PANEL, DISPLAY MODULE, AND DISPLAY DEVICE

FIELD OF INVENTION

The present application relates to the display field, in particular to a display panel, a display module, and a display device.

BACKGROUND OF INVENTION

With development of terminal display technology, users have increasingly higher demands for narrow bezel of display devices such as mobile phones. Therefore, a way in which electronic components such as a camera are placed on the bezel can no longer satisfy the demands of users. In current technology, in order to achieve the demands of narrow bezel, an irregular-shaped screen is obtained by carrying out irregular-shaped cutting of a display panel, such as a notch screen, a water drop screen, etc. Then, the electronic components are disposed in a special-shaped area. However, such narrow bezel technology requires cutting the display panel, while the process is complicated and the cutting area cannot emit light. That is, the current narrow bezel technology has a technical problem that the display panel needs to be cut.

Technical Problem

The present application provides a display panel, a display module, and a display device to solve the technical problem of current narrow bezel technology that requires cutting the display panel.

SUMMARY OF INVENTION

To solve the above problems, the technical solutions provided by this application are as follows:

The present application provides a display panel, including: a flexible substrate; a driving circuit layer and a light-emitting functional layer disposed on the flexible substrate; wherein the flexible substrate includes a first flexible substrate, a second flexible substrate, and an inorganic layer between the first flexible substrate and the second flexible substrate, the first flexible substrate is disposed on one side of the second flexible substrate away from the driving circuit layer; and the first flexible substrate is provided with a first through-hole corresponding to a lighting path of an electronic component.

In the display panel provided by an embodiment of the present application, the first through-hole extends to the inorganic layer and penetrates the inorganic layer.

In the display panel provided by an embodiment of the present application, the first through-hole extends to the second flexible substrate and does not penetrate the second flexible substrate.

In the display panel provided by an embodiment of the present application, the inorganic layer is provided with an annular opening, and an outer boundary of the annular opening coincides with a boundary of the first through-hole.

In the display panel provided by an embodiment of the present application, the first through-hole is one of circular and square.

In the display panel provided by an embodiment of the present application, the material of the first flexible substrate and the second flexible substrate is polyimide.

An embodiment of the present application provides a display module including a display panel. The display panel includes: a flexible substrate; a driving circuit layer and a light-emitting functional layer disposed on the flexible substrate; wherein the flexible substrate includes a first flexible substrate, a second flexible substrate, and an inorganic layer between the first flexible substrate and the second flexible substrate, the first flexible substrate is disposed on one side of the second flexible substrate away from the driving circuit layer; and the first flexible substrate is provided with a first through-hole corresponding to a lighting path of an electronic component; a support film attached to the first flexible substrate and configured to support the display panel.

In the display module provided by an embodiment of the present application, the support film is provided with a second through-hole, and there is an overlapping area between the first through-hole and the second through hole in the lighting path of the electronic component.

In the display module provided by an embodiment of the present application, the support film includes a support layer and an adhesive layer, and the support layer is bonded to the first flexible substrate by the adhesive layer.

In the display module provided by an embodiment of the present application, the material of the support layer is ethylene terephthalate or polyimide.

In the display module provided by an embodiment of the present application, the material of the adhesive layer is a pressure-sensitive adhesive or an optical adhesive.

In the display module provided by an embodiment of the present application, the first through-hole and the second through-hole are circular, and a diameter of the first through-hole is less than a diameter of the second through-hole.

In the display module provided by an embodiment of the present application, the first through-hole and the second through-hole are square, and a side length of the first through-hole is less than a side length of the second through-hole.

An embodiment of the present application provides a display device, including a display module, wherein the display module includes a display panel and a support film; an electronic component disposed below the display module.

In the display device provided by an embodiment of the present application, the support film is provided with a second through-hole, and there is an overlapping area between the first through-hole and the second through hole in the lighting path of the electronic component.

In the display device provided by an embodiment of the present application, all or part of the lighting unit of the electronic component is placed in the second through-hole.

In the display device provided by an embodiment of the present application, the support film includes a support layer and an adhesive layer, and the support layer is bonded to the first flexible substrate by the adhesive layer.

In the display device provided by an embodiment of the present application, the material of the support layer is ethylene terephthalate or polyimide.

In the display device provided by an embodiment of the present application, the material of the adhesive layer is a pressure-sensitive adhesive or an optical adhesive.

In the display device provided by an embodiment of the present application, the first through-hole and the second through-hole are circular, and a diameter of the first through-hole is less than a diameter of the second through-hole.

Beneficial Effect

Beneficial effects of the present application: The present application provides a display panel, a display module, and a display device. The display panel includes a flexible substrate; and a driving circuit layer and a light-emitting functional layer disposed on the flexible substrate, wherein the flexible substrate includes a first flexible substrate, a second flexible substrate, and an inorganic layer between the first flexible substrate and the second flexible substrate, the first flexible substrate is disposed on one side of the second flexible substrate away from the driving circuit layer, and the first flexible substrate is provided with a first through-hole corresponding to a lighting path of an electronic component. Based on the through-hole, light transmittance of the display panel is increased, so that electronic components such as a camera can be disposed below the display panel, and a narrow bezel design is realized. In addition, based on the second flexible substrate, there is no need to cut the display panel, which solves the technical problem of the current narrow bezel technology that requires cutting the display panel.

DESCRIPTION OF DRAWINGS

In order to more clearly explain the embodiments or the technical solutions in the prior art, the following will briefly introduce the drawings required in the embodiments or the description of the prior art. Obviously, the drawings in the following description are only some embodiments of the application, and those of ordinary skill in the art can obtain other drawings based on these drawings without creative efforts.

DETAILED DESCRIPTION OF PREFERRED EMBODIMENTS

Figure 1:
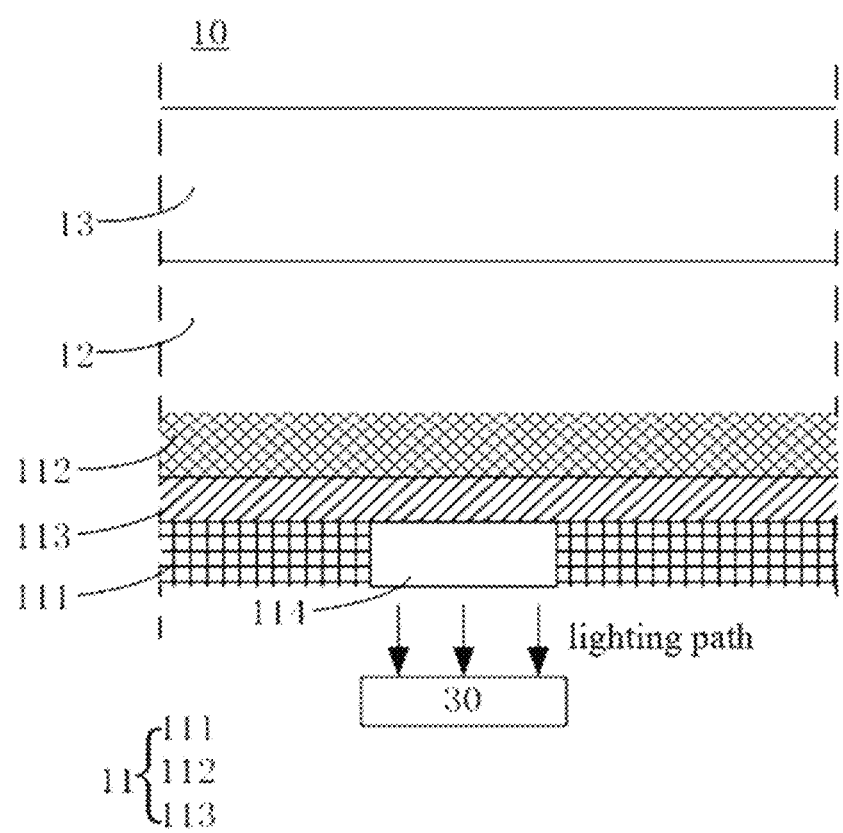
FIG. 1 is a first schematic structural diagram of a display panel provided by an embodiment of the present application.

The following description of the embodiments is provided to illustrate the specific embodiments of the invention. Directional terminology mentioned in the application, such as "above", "under", "front", "back", "left", "right", "inside", "outside", "side", etc., are only refer to the directions of the accompanying drawings. Therefore, the directional terminology is to illustrate and understand this application, not to limit this application. In the drawings, structurally similar units are denoted by the same reference numerals.

The present application addresses the technical problem that the current narrow bezel technology needs to cut the display panel, which can be solved by the embodiments of this application.

As shown in FIG. 1, an embodiment of the present application provides a display panel. The display panel 10 includes a flexible substrate 11; and a driving circuit layer 12 and a light-emitting functional layer 13 disposed on the flexible substrate 11, wherein the flexible substrate 11 includes a first flexible substrate 111, a second flexible substrate 112, and an inorganic layer 113 between the first flexible substrate 111 and the second flexible substrate 112, the first flexible substrate 111 is disposed on one side of the second flexible substrate 112 away from the driving circuit layer, and the first flexible substrate 111 is provided with a first through-hole 114 corresponding to a lighting path of an electronic component 30.

The present application provides a display panel. The display panel includes a flexible substrate; and a driving circuit layer and a light-emitting functional layer disposed on the flexible substrate, wherein the flexible substrate includes a first flexible substrate, a second flexible substrate, and an inorganic layer between the first flexible substrate and the second flexible substrate, the first flexible substrate is disposed on one side of the second flexible substrate away from the driving circuit layer, and the first flexible substrate is provided with a first through-hole corresponding to a lighting path of an electronic component. Based on the through-hole, light transmittance of the display panel is increased, so that electronic components such as a camera can be disposed below the display panel, and a narrow bezel design is realized. In addition, based on the second flexible substrate, there is no need to cut the display panel, which solves the technical problem of the current narrow bezel technology that requires cutting the display panel.

In one embodiment, the center of the lighting path coincides with the center of the first through-hole 114, which can reduce the area of the first through-hole 114.

In one embodiment, in order to enhance the light transmission effect, the first through-hole 114 extends to the inorganic layer 113 and does not penetrate the inorganic layer 113. Based on this structure, the inorganic layer 113 is thinner in the lighting path of the electronic component, which reduces blockage of light by the inorganic layer 113.

Figure 2:
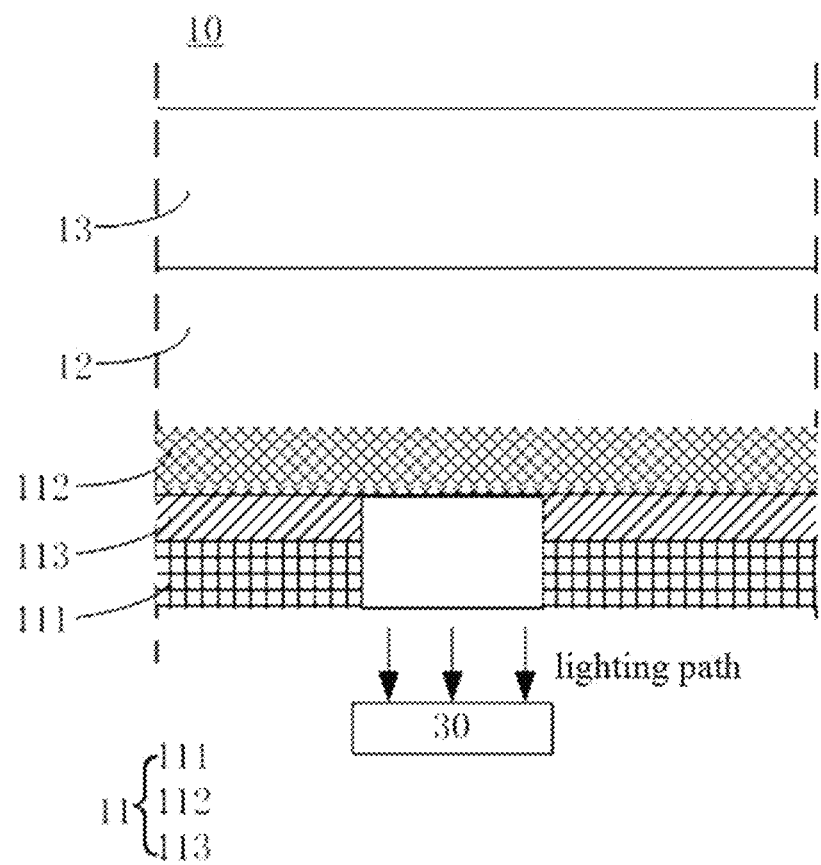
FIG. 2 is a second schematic structural diagram of a display panel provided by an embodiment of the present application.

In one embodiment, in order to enhance the light transmission effect, as shown in FIG. 2, the first through-hole 114 extends to the inorganic layer 113 and penetrates the inorganic layer 113. Based on this structure, the inorganic layer 113 does not exist in the lighting path of the electronic component, which prevents the inorganic layer 113 from blocking light.

Figure 3:
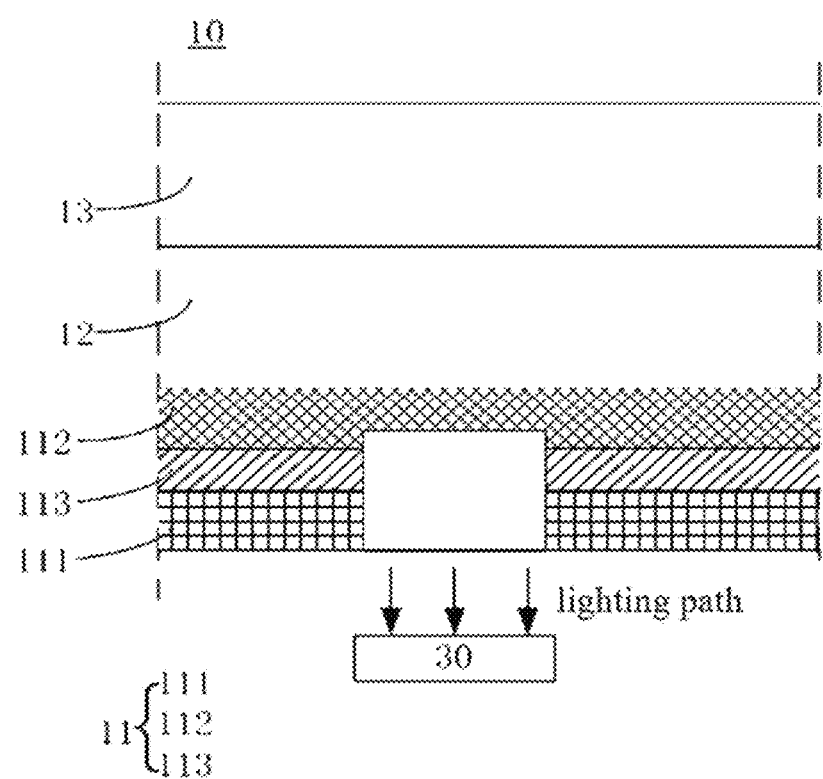
FIG. 3 is a third schematic structural diagram of a display panel provided by an embodiment of the present application.

In one embodiment, in order to enhance the light transmission effect, as shown in FIG. 3, the first through-hole 114 extends to the second flexible substrate 112 and does not penetrate the second flexible substrate 114. Based on processes such as laser processing, a desired shape can be obtained, and the film layer is flat. Based on this structure, the second flexible substrate 112 is thinner in the lighting path of the electronic component, which reduces blockage of light by the second flexible substrate 112 and improves the working effect of the electronic component.

In one embodiment, the first through-hole 114 extends to one-third to two-thirds of the thickness of the second flexible substrate 112.

Figure 4:
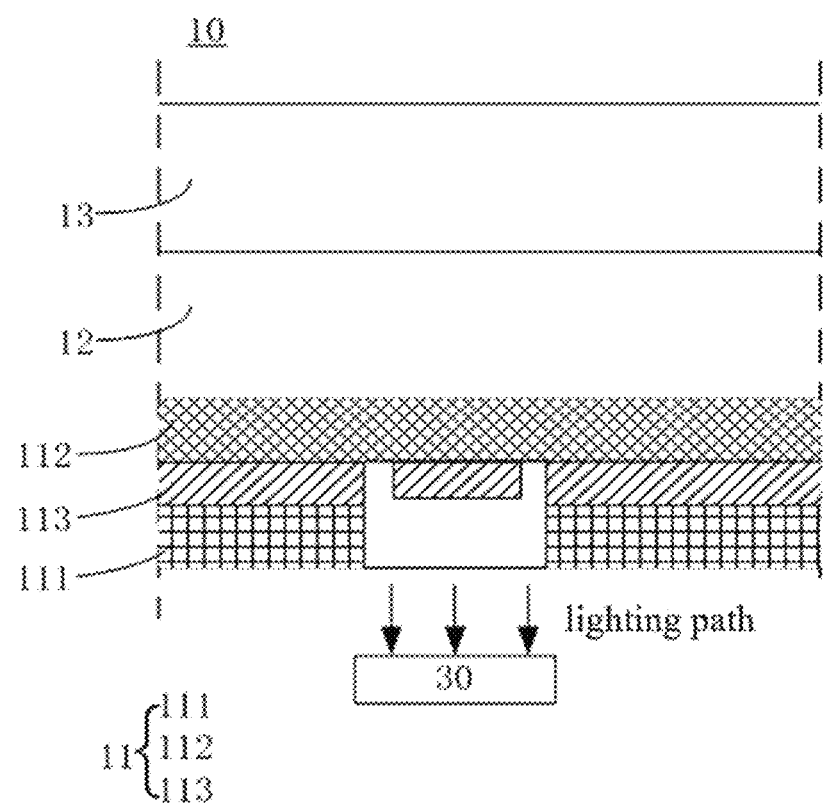
FIG. 4 is a fourth schematic structural diagram of a display panel provided by an embodiment of the present application.

In one embodiment, in order to reduce process requirements, as shown in FIG. 4, the inorganic layer 113 is provided with an annular opening 115 whose outer boundary coincides with a boundary of the first through-hole 114.

In one embodiment, in order to reduce the processing difficulty, a shape of the first through-hole 113 is one of circular or square.

In one embodiment, a material of the first flexible substrate and the second flexible substrate is one of organic materials such as polyimide or ethylene terephthalate, so as to reduce costs and enhance flexibility.

Figure 5:
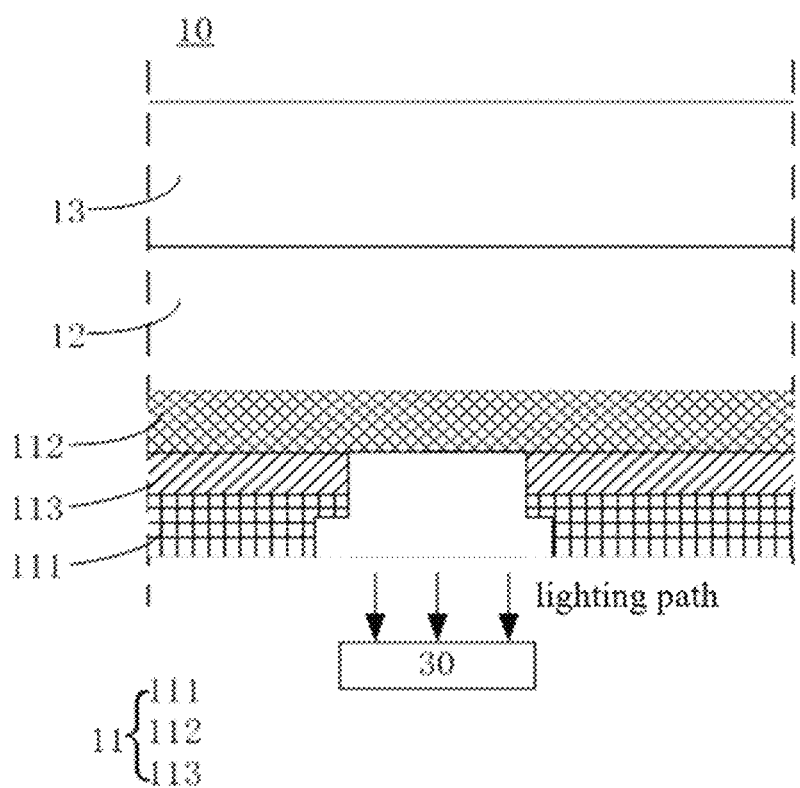
FIG. 5 is a fifth schematic structural diagram of a display panel provided by an embodiment of the present application.

In one embodiment, as shown in FIG. 5, the cross-section of the first through-hole 114 is stepped, which reduces the difficulty of the process.

In one embodiment, the flexible display panel 10 provided in this embodiment includes: a flexible substrate 11 including a first flexible substrate 111, a second flexible substrate 112, and an inorganic layer 113 between the first flexible substrate 111 and the second flexible substrate 112, wherein the first flexible substrate 111 is disposed on one side of the second flexible substrate 112 away from the driving circuit layer 12; a driving circuit layer 12 including a buffer layer, an active layer, a gate insulating layer, a gate metal layer, an interlayer insulating layer, a source-drain metal layer, and a passivation layer; and a light-emitting functional layer 13 including an anode metal layer, a pixel definition layer, an OLED light-emitting layer, and an encapsulation layer. A through-hole is formed in the interlayer insulating layer, and the source-drain metal layer communicates with the active layer by the through-hole.

In one embodiment, material of the pixel definition layer is a macromolecule organic polymer with high Young's modulus.

In one embodiment, the macromolecule organic polymer is polydimethylsiloxane. Polydimethylsiloxane has a high Young's modulus, can play a good role in supporting the flexible display device, disperse applied stress (compressive/bending stress), and can protect the flexible display panel.

In one embodiment, the pixel definition layer further includes a black dye. The black dye is used to form the black pixel definition layer, and the black pixel definition layer is beneficial for blocking lateral light leakage between adjacent sub-pixels, thereby improving a contrast of the flexible display panel.

In one embodiment, the pixel definition layer is prepared by a nano-transfer method.

In one embodiment, the through-hole penetrates the interlayer insulating layer and stops at the active layer. Forming the through-hole in the interlayer insulating layer is mainly for communicating the source-drain metal layer with the active layer.

In one embodiment, the OLED light-emitting layer includes a red sub-pixel light-emitting layer, a green sub-pixel light-emitting layer, and a blue sub-pixel light-emitting layer.

In one embodiment, a material of the buffer layer is one or both of silicon nitride or silicon oxide, and a thickness of the buffer layer is 2000 to 3000 angstroms.

In one embodiment, a material of the gate insulating layer is silicon nitride or silicon oxide, and a thickness of the gate insulating layer is 800 to 1000 angstroms.

In one embodiment, a thickness of the interlayer insulating layer is 2000 to 3000 angstroms.

In one embodiment, a material of the source-drain metal layer is titanium or titanium aluminum alloy.

In one embodiment, a material of the gate metal layer is molybdenum or the like.

In one embodiment, a material of the anode metal layer is indium tin oxide or the like.

In one embodiment, the encapsulation layer includes a first inorganic encapsulation layer, a first organic encapsulation layer, and a second inorganic encapsulation layer that are stacked. A material of the first inorganic encapsulating layer is one or a combination of any two or more of silicon nitride, silicon dioxide, aluminum oxide, titanium dioxide, and zirconium dioxide. A material of the second inorganic encapsulation layer is same as the material of the first inorganic encapsulation layer.

In one embodiment, in the lighting path of the electronic component 30, a third through-hole is formed in the driving circuit layer 12 and the light-emitting functional layer 13, and the first inorganic encapsulation layer is formed on the second flexible substrate 112 to further enhance light transmission effect.

Figure 6:
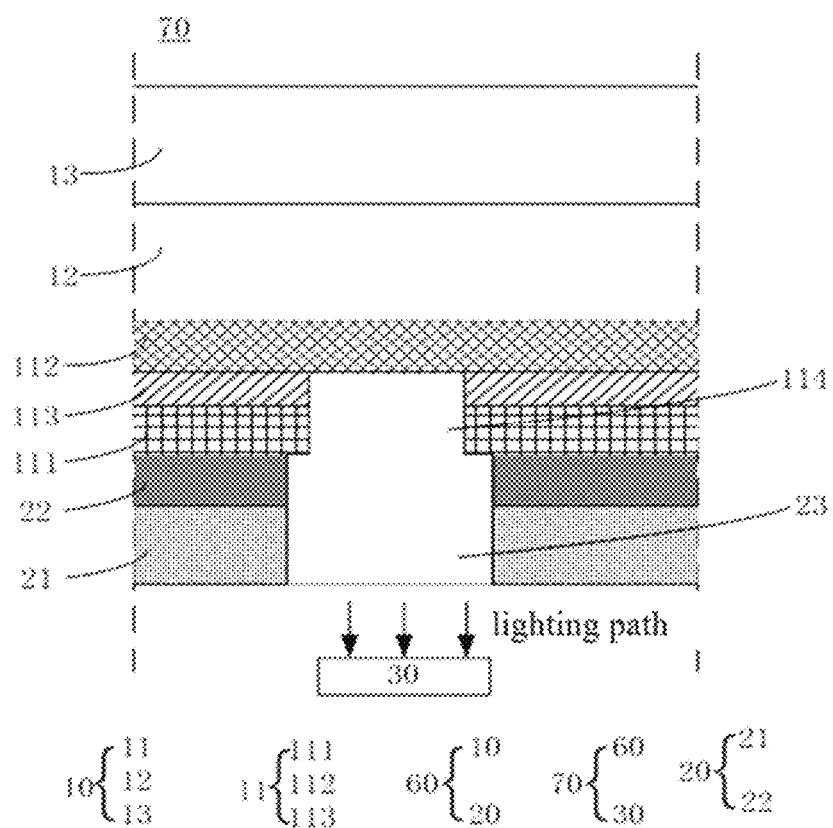
FIG. 6 is a schematic structural diagram of a display device provided by an embodiment of the present application.

As shown in FIG. 6, one embodiment of the present application provides a display module. The display module 60 includes a display panel 10. The display panel 10 includes: a flexible substrate 11; a driving circuit layer 12 and a light-emitting functional layer 13 disposed on the flexible substrate 11, wherein the flexible substrate 11 includes a first flexible substrate 111, a second flexible substrate 112, and an inorganic layer 113 between the first flexible substrate 111 and the second flexible substrate 112, the first flexible substrate 111 is disposed on a side of the second flexible substrate 112 away from the driving circuit layer 12, and the first flexible substrate 111 is provided with a first through-hole 114 corresponding to a lighting path of an electronic component 30; and a support film 20 attached to the first flexible substrate 111 and configured to support the display panel 10.

The display panel in the display module includes a flexible substrate, a driving circuit layer, and a light-emitting functional layer provided on the flexible substrate. The flexible substrate includes a first flexible substrate, a second flexible substrate, and an inorganic layer between the first flexible substrate and the second flexible substrate. The first flexible substrate is disposed on a side of the second flexible substrate away from the driving circuit layer. The first flexible substrate is provided with a first through-hole in the lighting path of the electronic component. Based on the through-hole, light transmittance of the display panel is increased, so that electronic components such as a camera can be placed under the display panel, a narrow bezel design is realized, and based on the second flexible substrate, there is no need to cut the display panel.

In one embodiment, as shown in FIG. 6, the support film 20 includes a support layer 21 and an adhesive layer 22. The support layer 21 is bonded to the first flexible substrate 111 by the adhesive layer 22.

In one embodiment, as shown in FIG. 6, the support film 20 is provided with a second through-hole 23. In the lighting path of the electronic component 30, there is an overlapping area between the first through-hole 114 and the second through-hole 23 to further enhance the lighting effect of the electronic component.

In one embodiment, a material of the support layer 21 is one of ethylene terephthalate or polyimide.

In one embodiment, a material of the adhesive layer 22 is one of a pressure-sensitive adhesive or an optical adhesive.

In one embodiment, as shown in FIG. 6, the first through-hole 114 and the second through-hole 23 are circular, and a diameter of the first through-hole 114 is less than a diameter of the second through-hole 23.

In one embodiment, the first through-hole and the second through-hole are square, and a side length of the first through-hole is less than a side length of the second through-hole.

In one embodiment, as shown in FIG. 6, the first through-hole 114 is located in an area where the second through-hole 23 is defined.

In one embodiment, the display module 70 further includes a polarizer, a touch panel, etc. disposed on the display panel 10 to achieve complete touch and display functions.

In one embodiment, the present application provides a display device. As shown in FIG. 6, the display device 70 includes a display module 60. The display module 60 includes a display panel 10, a support film 20, and an electronic component 30 disposed below the display module.

In one embodiment, as shown in FIG. 6, the support film 20 is provided with a second through-hole 23, and there is an overlapping area between the first through-hole 114 and the second through-hole 23 in the lighting path of the electronic component 30.

In one embodiment, all or part of the lighting unit of the electronic component 30 is placed in the second through-hole to further reduce the thickness of the display device.

In one embodiment, the electronic component 30 is a camera module, and the lighting unit of the camera module is a lens. The lens is placed completely or partially in the second through-hole.

Meanwhile, in one embodiment, the present application provides a method for assembling a display device, including following steps:

Step 1, providing a display module.

In one embodiment, the display module includes a display panel and a support film. The display panel includes a flexible substrate; and a driving circuit layer and a light-emitting functional layer disposed on the flexible substrate, wherein the flexible substrate includes a first flexible substrate, a second flexible substrate, and an inorganic layer between the first flexible substrate and the second flexible substrate, the first flexible substrate is disposed on a side of the second flexible substrate away from the driving circuit layer, and the first flexible substrate is provided with a first through-hole corresponding to a lighting path of an electronic component. The support film is provided with a second through-hole, and there is an overlapping area between the first through-hole and the second through hole in the lighting path of the electronic component.

Step 2, assembling the electronic component and the display module.

In one embodiment, the electronic component is a camera module, the lighting unit of the camera module is a lens, and the lens is placed completely or partially in the second through-hole.

Figure 7:
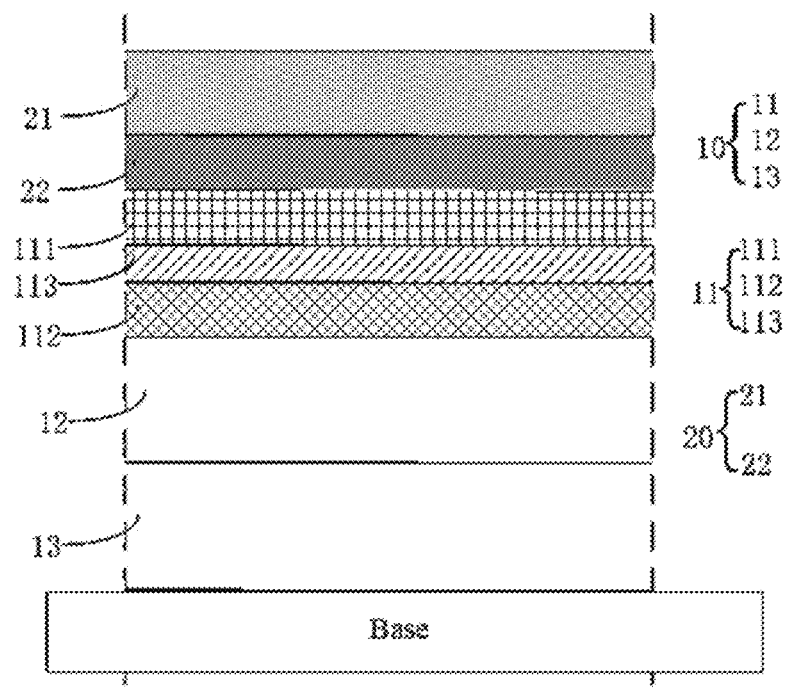
FIG. 7 to FIG. 14 are schematic diagrams of assembly of a display device provided by an embodiment of the present application.

In one embodiment, as shown in FIG. 7 to FIG. 10, the step of providing a display module includes following steps:

Step a1, as shown in FIG. 7, the support film 20 and the display panel 10 are bonded together and placed upside down on the machine table.

The flexible display panel 10 provided in this step has not formed a first through-hole, and the flexible support film 20 has not formed a second through-hole.

Figure 8:
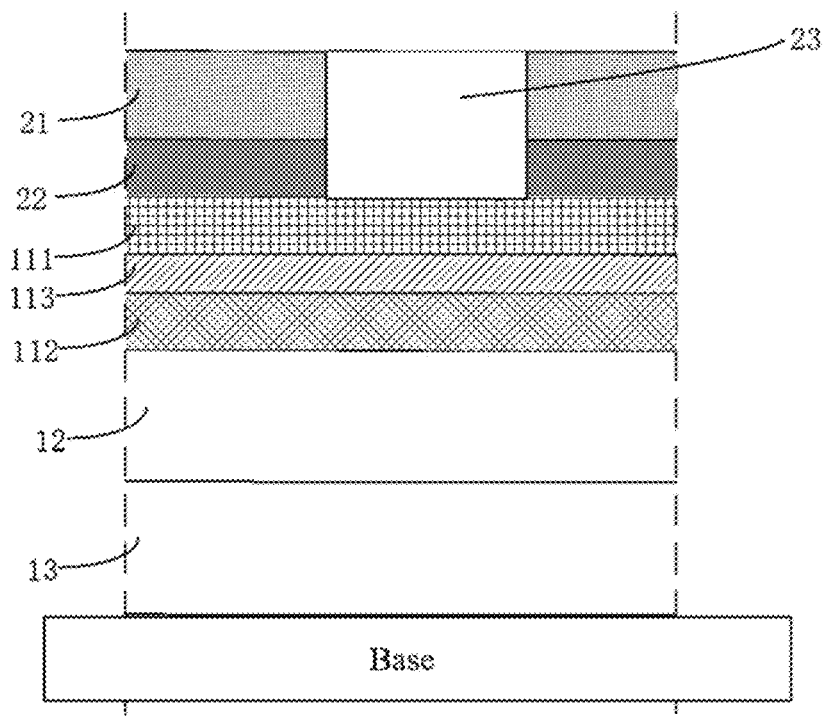

Step a2, as shown in FIG. 8, laser cutting the support film 20, wherein a cutting method is using a laser to cut a circular shape, a cutting depth is a total thickness of the support film 20, and the support film 20 in the cutting area is then torn off to form a second through-hole 23.

Figure 9:
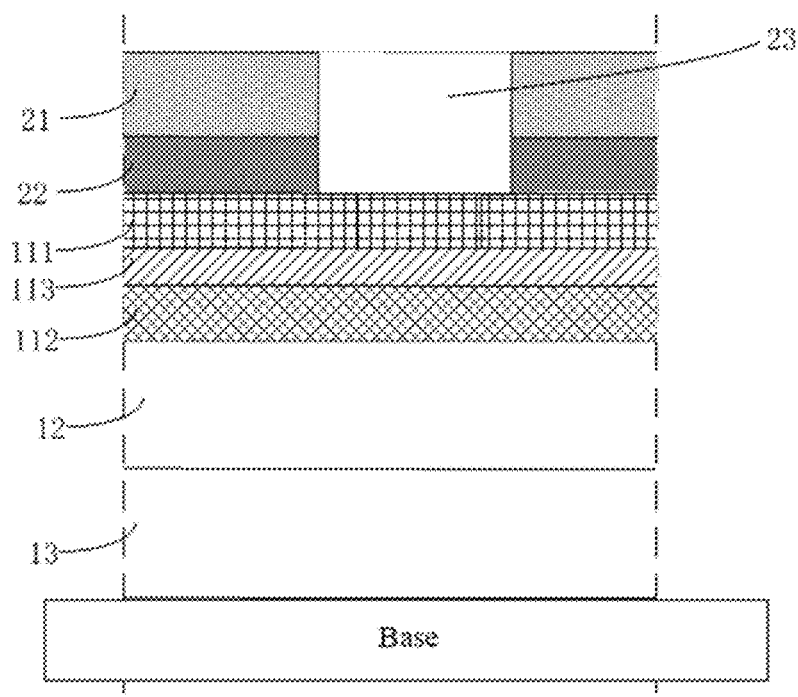

Step a3, as shown in FIG. 9, performing a first laser processing on the first flexible substrate for the purpose of separating the first flexible substrate and the second flexible substrate.

Figure 10:
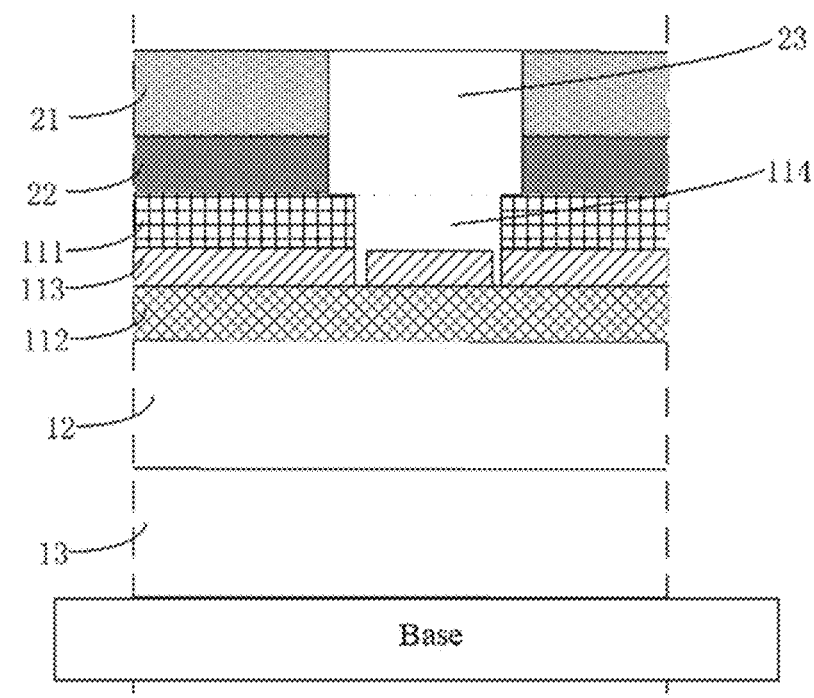

Step a4, as shown in FIG. 10, performing a second laser processing on the first flexible substrate, wherein a processing method is cutting, a cutting shape is circular, and a cutting depth is a sum of thicknesses of the first flexible substrate 111 and the inorganic layer 112. After the cutting is completed, the first flexible substrate 111 is torn off to form the first through-hole 114.

In this embodiment, an advantage of using a laser process to process the flexible substrate to form the first through-hole 114 is that the bottom of a groove formed by the first through-hole and the second flexible substrate is flat, which can effectively reduce haze of the flexible substrate and effectively improve visible light transmittance.

In one embodiment, an opening area of the second through-hole 23 is greater than an opening area of the first through-hole 114, which facilitates laser processing and material removal of the first through-hole 114.

In one embodiment, a processing area of the second laser processing is greater than a processing area of the first laser processing, so that a ring-shaped opening 115 is formed in an inorganic layer 113, which prevents the first flexible substrate from being separated from the inorganic layer at the site of the first through-hole 114. The width of the ring-shaped opening 115 may meet the requirement of the tearing process of the first flexible substrate, for example, the width may be 50 nm to 1000 nm.

Figure 11:
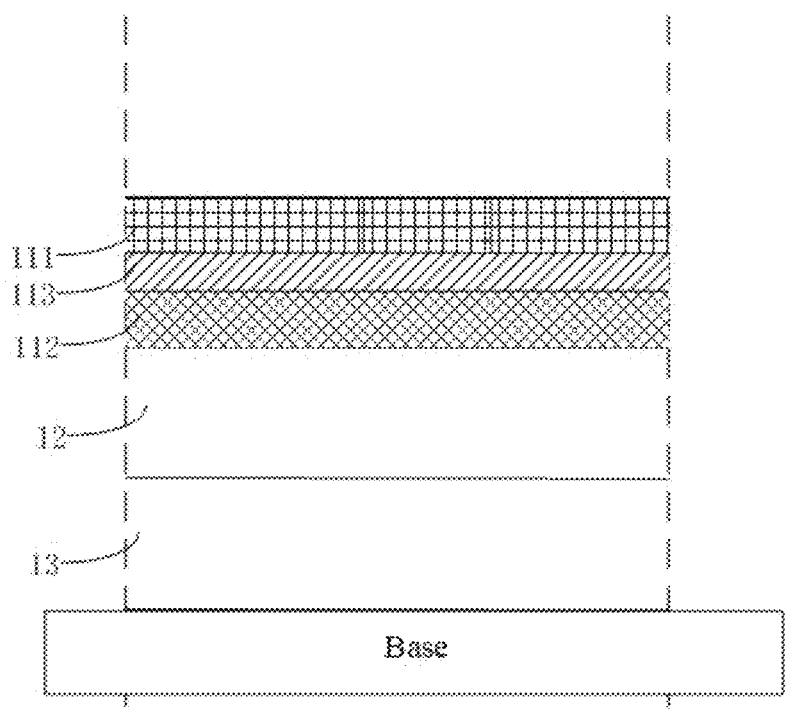

In one embodiment, as shown in FIG. 11 to FIG. 14, the step of providing a display module includes following steps:

Step b1, as shown in FIG. 11, the display panel is placed upside down on the machine table, and the first flexible substrate is subjected to the first laser processing for the purpose of separating the first flexible substrate and the second flexible substrate.

Figure 12:
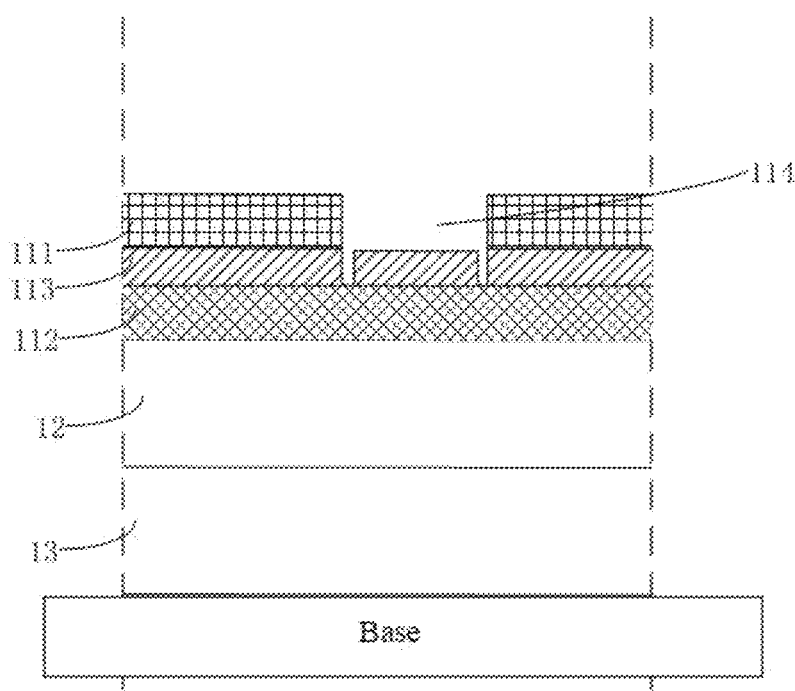

Step b2, as shown in FIG. 12, performing a second laser processing on the first flexible substrate.

A processing method is cutting, a cutting shape is circular, and a cutting depth is a sum of the thicknesses of the first flexible substrate 111 and the inorganic layer 112. After the cutting is completed, the first flexible substrate 111 is torn off to form the first through-hole 114.

Figure 13:
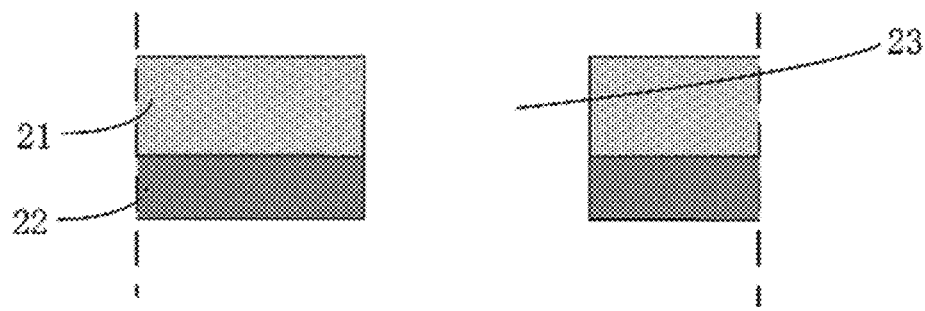

Step b3, as shown in FIG. 13, providing a support film.

As shown in FIG. 13, the support film 20 with the second through-hole is provided, that is, the support film 20 with a hole is used to reduce laser processing.

Figure 14:
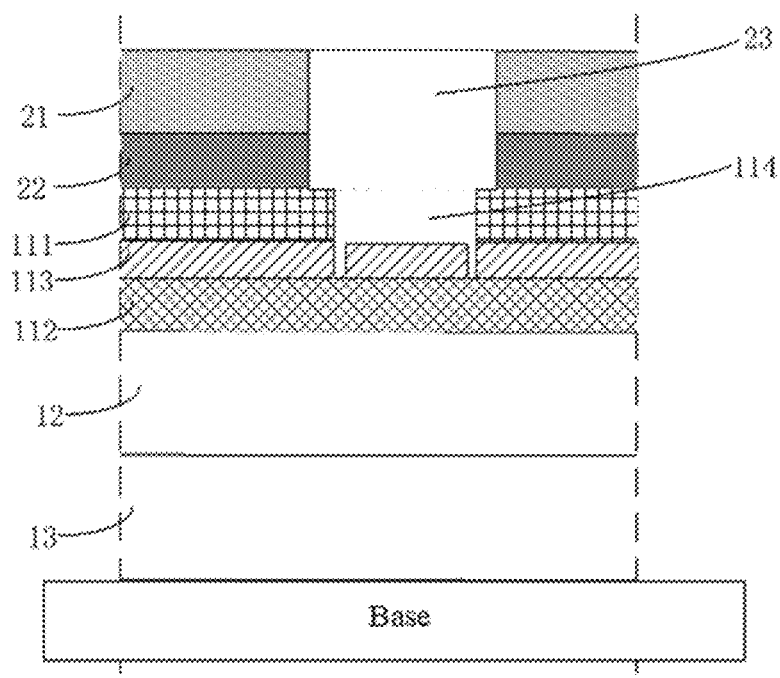

Step b4, as shown in FIG. 14, the support film 20 and the display panel 10 are bonded together.

According to the above embodiment, the present application provides a display panel, a display module, and a display device. The display panel includes a flexible substrate; and a driving circuit layer and a light-emitting functional layer disposed on the flexible substrate, wherein the flexible substrate includes a first flexible substrate, a second flexible substrate, and an inorganic layer between the first flexible substrate and the second flexible substrate, the first flexible substrate is disposed on a side of the second flexible substrate away from the driving circuit layer, and the first flexible substrate is formed with a first through-hole corresponding to a lighting path of an electronic component. Based on the through-hole, light transmittance of the display panel is increased, so that electronic components such as a camera can be disposed below the display panel, and a narrow bezel design is realized. In addition, based on the second flexible substrate, there is no need to cut the display panel, which solves the technical problem of the current narrow bezel technology that requires cutting the display panel.

In summary, although the present application has been disclosed above with the preferred embodiments, the preferred embodiments are not intended to limit the present application. Those of ordinary skill in the art can make various changes and modifications without departing from the spirit and scope of the present application. Therefore, the protection scope of the present application shall be subject to the scope defined by the claims.

What is claimed is:

1. A display panel, comprising:
a flexible substrate; and
a driving circuit layer and a light-emitting functional layer disposed on the flexible substrate;
wherein the flexible substrate comprises a first flexible substrate, a second flexible substrate, and an inorganic layer between the first flexible substrate and the second flexible substrate, the first flexible substrate is disposed on one side of the second flexible substrate away from the driving circuit layer, and the first flexible substrate is provided with a first through-hole corresponding to a lighting path of an electronic component, wherein a ring-shaped opening is formed in the inorganic layer, and an outer boundary of the ring-shaped opening coincides with a boundary of the first through hole, wherein the ring-shaped opening includes a portion of the inorganic layer within the ring-shaped opening.

2. The display panel according to claim 1, wherein the first through-hole extends to the inorganic layer and penetrates the inorganic layer.

3. The display panel according to claim 2, wherein the first through-hole extends to the second flexible substrate and does not penetrate the second flexible substrate.

4. The display panel according to claim 2, wherein the first through-hole is circular or square.

5. The display panel according to claim 1, wherein material of the first flexible substrate and the second flexible substrate is polyimide.

6. A display module comprising the display panel of claim 1, the display panel comprising:
the flexible substrate;
the driving circuit layer and the light-emitting functional layer disposed on the flexible substrate;
wherein the flexible substrate comprises the first flexible substrate, the second flexible substrate, and the inorganic layer between the first flexible substrate and the second flexible substrate, the first flexible substrate is disposed on the one side, and the first flexible substrate is provided with the first through-hole corresponding to the lighting path of the electronic component; and
a support film attached to the first flexible substrate and configured to support the display panel.

7. The display module according to claim 6, wherein the support film is provided with a second through-hole, and there is an overlapping area between the first through-hole and the second through-hole in the lighting path of the electronic component.

8. The display module according to claim 7, wherein the support film comprises a support layer and an adhesive layer, and the support layer is bonded to the first flexible substrate by the adhesive layer.

9. The display module according to claim 8, wherein material of the support layer is ethylene terephthalate or polyimide.

10. The display module according to claim 8, wherein material of the adhesive layer is a pressure-sensitive adhesive or an optical adhesive.

11. The display module according to claim 7, wherein the first through-hole and the second through-hole are circular, and a diameter of the first through-hole is less than a diameter of the second through-hole.

12. The display module according to claim 7, wherein the first through-hole and the second through-hole are square, and a side length of the first through-hole is less than a side length of the second through-hole.

13. A display device, comprising:
the display module of claim 6 comprising the display panel and the support film; and
the electronic component disposed below the display module.

14. The display device according to claim 13, wherein the support film is provided with a second through-hole, and there is an overlapping area between the first through-hole and the second through-hole in the lighting path of the electronic component.

15. The display device according to claim 13, wherein the support film comprises a support layer and an adhesive layer, and the support layer is bonded to the first flexible substrate by the adhesive layer.

16. The display device according to claim 15, wherein material of the support layer is ethylene terephthalate or polyimide.

17. The display device according to claim 15, wherein material of the adhesive layer is a pressure-sensitive adhesive or an optical adhesive.

18. The display device according to claim 13, wherein the first through-hole and the second through-hole are circular, and a diameter of the first through-hole is less than a diameter of the second through-hole.

* * * * *